(12) United States Patent
Ishii et al.

(10) Patent No.: US 9,169,436 B2
(45) Date of Patent: Oct. 27, 2015

(54) PHOSPHOR AND LED LIGHT EMITTING DEVICE USING THE SAME

(75) Inventors: Tsutomu Ishii, Yokohama (JP); Yoshitaka Funayama, Yokohama (JP); Yumi Ito, Yokohama (JP); Yasumasa Ooya, Chigasaki (JP); Ryo Sakai, Yokohama (JP); Katsutoshi Nakagawa, Yokohama (JP); Hajime Takeuchi, Yokohama (JP); Yasuhiro Shirakawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 555 days.

(21) Appl. No.: 13/470,588

(22) Filed: May 14, 2012

(65) Prior Publication Data

US 2012/0223352 A1 Sep. 6, 2012

Related U.S. Application Data

(62) Division of application No. 12/746,665, filed as application No. PCT/JP2008/072011 on Dec. 4, 2008, now Pat. No. 8,487,330.

(30) Foreign Application Priority Data

Dec. 7, 2007 (JP) ................................ P2007-317601

(51) Int. Cl.
*H01L 51/52* (2006.01)
*C09K 11/08* (2006.01)
(Continued)

(52) U.S. Cl.
CPC ......... *C09K 11/0883* (2013.01); *C09K 11/7734* (2013.01); *C09K 11/7738* (2013.01); *C09K 11/7789* (2013.01); *H01L 33/502* (2013.01)

(58) Field of Classification Search
CPC ..................... H01L 51/5052; H01L 51/5088
USPC .................... 438/22–26, 46, E51.018
See application file for complete search history.

(56) References Cited

U.S. PATENT DOCUMENTS

| 3,875,453 | A | 4/1975 | Thornton, Jr. |
| 7,514,020 | B2 | 4/2009 | Zeng et al. |

(Continued)

FOREIGN PATENT DOCUMENTS

| JP | 10-36835 | 2/1998 |
| JP | 2002-42525 | 2/2002 |

(Continued)

OTHER PUBLICATIONS

Notification of Reason for Rejection issued by the Japanese Patent Office on Feb. 15, 2013, for Japanese Patent Application No. 2009-544699, and English-language translation thereof.

(Continued)

*Primary Examiner* — Cuong Q Nguyen
(74) *Attorney, Agent, or Firm* — Finnegan, Henderson, Farabow, Garrett & Dunner, L.L.P.

(57) ABSTRACT

An LED light emitting device is provided that has high color rendering properties and is excellent color uniformity and, at the same time, can realize even luminescence unattainable by conventional techniques. A phosphor having a composition represented by formula: $(Sr_{2-X-Y-Z-\omega}Ba_XMg_YMn_ZEu_\omega)SiO_4$ wherein x, y, z, and ω are respectively coefficients satisfying $0.1<x<1$, $0<y<0.5$, $0<z<0.1$, $y>z$, and $0.01<\omega<0.2$ is provided. The phosphor is used in combination with ultraviolet and blue light emitting diodes having a luminescence peak wavelength of 360 to 470 nm to form an LED light emitting device.

3 Claims, 2 Drawing Sheets

(51) Int. Cl.
  *C09K 11/77* (2006.01)
  *H01L 33/50* (2010.01)

(56) References Cited

U.S. PATENT DOCUMENTS

| | | | |
|---|---|---|---|
| 7,961,762 B2 | 6/2011 | Ishii et al. | |
| 8,628,986 B2 * | 1/2014 | Amamiya et al. | 438/29 |
| 8,928,028 B2 * | 1/2015 | Morishima | 438/99 |
| 2010/0210047 A1 * | 8/2010 | Sasaki et al. | 438/26 |
| 2010/0214763 A1 | 8/2010 | Katou et al. | |
| 2011/0186833 A1 * | 8/2011 | Iwasaki | 438/46 |
| 2013/0323869 A1 * | 12/2013 | Inoue et al. | 438/46 |

FOREIGN PATENT DOCUMENTS

| | | |
|---|---|---|
| JP | 2002-151747 | 5/2002 |
| JP | 2002-198573 | 7/2002 |
| JP | 2003-179259 | 6/2003 |
| JP | 2004-115304 | 4/2004 |
| JP | 2005-8844 | 1/2005 |
| JP | 2005-150691 | 6/2005 |
| JP | 2005-235847 | 9/2005 |
| JP | 2005-243699 | 9/2005 |
| JP | 2005-317985 | 11/2005 |
| JP | 3749243 | 12/2005 |
| JP | 2006-25336 | 1/2006 |
| JP | 2006-41096 | 2/2006 |
| JP | 2006-505659 | 2/2006 |
| JP | 2006-167946 | 6/2006 |
| JP | 2006-213893 | 8/2006 |
| JP | 2006-265542 | 10/2006 |
| JP | 2006-299168 | 11/2006 |
| JP | 2006-321974 | 11/2006 |
| JP | 2006-324407 | 11/2006 |
| JP | 2006-332692 | 12/2006 |
| JP | 2007-186674 | 7/2007 |
| JP | 5121736 | 11/2012 |
| KR | 10-0809639 | 3/2008 |
| WO | WO 2005/068584 A1 | 7/2005 |
| WO | WO 2005/083035 A1 | 9/2005 |
| WO | WO 2006/131795 A1 | 12/2006 |
| WO | WO 2008/078711 A1 | 7/2008 |
| WO | WO 2008/096545 A1 | 8/2008 |

OTHER PUBLICATIONS

Office Action issued by the Korean Patent Office on Apr. 5, 2012, for Korean Patent Application No. 2010-7013189, and partial English-language translation thereof.
IEEJ Journal (2007), 127:226-229 and 204.
International Search Report from the Japanese Patent Office in International Application No. PCT/JP2008/072011, mailed Jan. 6, 2009.
Office Action issued by the Korean Patent Office on Apr. 25, 2012, for Korean Patent Application No. 2010-7013189, and partial English-language translation thereof.
Notification of Examination Opinion issued by the Taiwanese Patent Office on Jun. 20, 2012, for Taiwanese Patent Application No. 097147445, and English-language translation thereof.

* cited by examiner

PHOSPHOR AND LED LIGHT EMITTING DEVICE USING THE SAME

This is a division of application Ser. No. 12/746,665, having a §371(c) date of Sep. 7, 2010, which is incorporated herein by reference.

TECHNICAL FIELD

The present invention relates to an LED light emitting device comprising a combination of an ultraviolet or ultraviolet to blue light emitting diode with a phosphor that absorbs light emitted by the light emitting diode to emit white to yellowish white light.

BACKGROUND ART

Light emitting diodes (hereinafter sometimes referred to as LED) are semiconductor diodes that emit light and convert electric energy to ultraviolet light or visible light. In particular, in order to utilize visible light, LED light emitting devices comprising a light emitting chip formed of a luminescent material such as GaP, GaAsP, GaAlAs, GaN, or InGaAlP which has been sealed with a transparent resin have been widely used.

Display-type LED light emitting devices comprising a luminescent material that is fixed on an upper surface of a printed board or a metallic lead and is sealed with a resin case on which numerals or letters are provided have also been extensively used. A method may also be adopted in which various phosphor powders are incorporated in the front surface of the light emitting chip or the front part of the resin for use in sealing of the light emitting chip to properly adjust the color of light emitted. That is, regarding the color of light emitted in the LED light emitting device, luminescence in a visible light range from blue to red can be reproduced depending upon the contemplated application of the LED light emitting device.

Light emitting diodes are semiconductor elements and have a prolonged service life and a high reliability and, thus, when used as a light source, can reduce the necessary frequency of exchange thereof. Accordingly, the light emitting diodes have been extensively used as components for constituting various display devices such as portable communication devices, peripheral devices of personal computers, OA equipment, electrical household machinery and equipment, audio equipment, various switches, and light source display plates for backlights.

Recently, chromatic sensation of users of the various display devices described above has been improved, and the function of reproducing subtle shades of color with higher definition and uniform appearance of LED light emitting devices have also become required of various display devices. In particular, in LED light emitting devices that emit white light, use in backlights of cellular phones, in-car lamps and the like has recently been significantly expanded, and, thus, significant growth of use of the LED light emitting devices that emit white light, as an alternative to fluorescent lamps, in the future is expected. In LED light emitting devices that emit white light, to bring an end to the expectation, various improvements have been attempted to realize high color rendering properties of the white light and a uniform appearance. Further, in the RHoS regulation which has come into force in European Union (EU) on July 2006, the use of mercury is prohibited, and it is considered that the conventional fluorescent lamps are replaced by white light emitting LED lamps not using mercury.

LED devices, which emit white light and are currently in widespread use or experimental use, are classified into a type in which a blue light emitting diode is combined with a yellow light emitting phosphor and, in some cases, further a red phosphor (hereinafter referred to as type 1) and a type in which an ultraviolet light or purple light emitting diode is combined with blue, yellow, and red phosphors (hereinafter referred to as type 2).

At the present time, type 1 has higher brightness than type 2 and is in the most widespread use. Materials such as cerium activated yttrium aluminate phosphors (hereinafter referred to as YAGs), cerium activated terbium aluminate phosphors (hereinafter referred to as TAGs), and alkaline earth silicate phosphors (hereinafter referred to as BOSS) have been put into practical use as yellow phosphors for type 1.

Among them, YAG and BOSS are phosphors that are well known before use in combination with light emitting diodes and, up to now, have been used or attempted to be applied to applications such as flying spot scanners and fluorescent lamps. These phosphors have already been put into practical use, for example, in backlights for cellular phones, but are daily improved with a view to aiming at further expansion, for example, to illumination lamps and head lamps in automobiles. Regarding the BOSS phosphors, for example, patent document 1 discloses an improvement in these phosphors. For aluminate phosphors such as YAG and TAG, for example, patent documents 2 to 21 disclose an improvement in these phosphors.

PRIOR ART DOCUMENTS

Patent document 1: Japanese Patent No. 3749243
Patent document 2: Japanese Patent Application Laid-Open No. 332692/2006
Patent document 3: Japanese Patent Application Laid-Open No. 299168/2006
Patent document 4: Japanese Patent Application Laid-Open No. 41096/2006
Patent document 5: Japanese Patent Application Laid-Open No. 317985/2005
Patent document 6: Japanese Patent Application Laid-Open No. 8844/2005
Patent document 7: Japanese Patent Application Laid-Open No. 179259/2003
Patent document 8: Japanese Patent Application Laid-Open No. 198573/2002
Patent document 9: Japanese Patent Application Laid-Open No. 151747/2002
Patent document 10: Japanese Patent Application Laid-Open No. 36835/1998
Patent document 11: Japanese Patent Application Laid-Open No. 321974/2006
Patent document 12: Japanese Patent Application Laid-Open No. 265542/2006
Patent document 13: Japanese Patent Application Laid-Open No. 213893/2006
Patent document 14: Japanese Patent Application Laid-Open No. 167946/2006
Patent document 15: Japanese Patent Application Laid-Open No. 243699/2005
Patent document 16: Japanese Patent Application Laid-Open No. 150691/2005
Patent document 17: Japanese Patent Application Laid-Open No. 115304/2004
Patent document 18: Japanese Patent Application Laid-Open No. 324407/2006

Patent document 19: Japanese Patent Application Laid-Open No. 25336/2006

Patent document 20: Japanese Patent Application Laid-Open No. 235847/2005

Patent document 21: Japanese Patent Application Laid-Open No. 42525/2002

Non-patent document 1: IEEJ Journal, Vol. 127, No. 4, p. 226-229, 2007

DISCLOSURE OF THE INVENTION

Problem to be Solved by the Invention

White light emitting LED devices of type 1 which are a combination of a blue light emitting diode with yellow light emitting phosphors such as BOSS or YAG and TAG are disadvantageous in that the amount of red light is not large enough to constitute white light. Accordingly, when the white light emitting LED device of type 1 is used for illumination purposes, the level of color rendering properties for reproducing the color of an object as a more natural color is low and, thus, even now, various improvements are continuously made.

Type 1 suffers from another problem that, since blue constituting white is emitted from one mass of a semiconductor chip while yellow is emitted from a powdery phosphor, mixing of blue light with yellow light is unsatisfactory and, consequently, in type 1, uneven portions of blue or yellow among white appear on illuminated areas (non-patent document 1). This problem should be solved from the viewpoint of the growth of use of white light emitting LED devices, for illumination, for use as an alternative to fluorescent lamps.

On the other hand, white LED devices of type 2 in which an ultraviolet or purple light emitting diode is combined with a blue, yellow, or red phosphor are based on the same principle as fluorescent lamps. Accordingly, the white LED devices of type 2 is characterized in that the level of color rendering properties can easily be enhanced and, at the same time, mixing of lights is satisfactory because all of color sources are derived from powdery phosphors, leading to an advantage that unevenness of color on illuminated areas as pointed out in type 2 is less likely to occur.

In actual production of LED devices of type 1, however, for example, due to a difference in particle diameter or specific gravity of phosphors, a difference in sedimentation rate between phosphors sometimes occurs at the step of coating phosphors of three colors of blue, yellow, and red. Accordingly, for example, a problem of poor appearance of white light emitting LED devices that a large amount of red phosphor is deposited on the bottom of phosphor coated areas and, consequently, the bottom of LED looks reddish, occurs. To overcome this problem, for example, an attempt has been made to reduce color unevenness by regulating particle diameters of each of the phosphors. At the present time, however, the problem has not been fully solved due to a balance with the luminescence efficiency of the phosphors.

Accordingly, an object of the present invention is to provide an LED light emitting device that has high color rendering properties and is excellent color uniformity and, at the same time, can realize even luminescence unattainable by conventional techniques, and a phosphor for use therein.

Means for Solving Problem

According to the present invention, there is provided a phosphor characterized by having a composition represented by the following chemical formula:

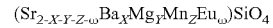
$(Sr_{2-X-Y-Z-\omega}Ba_XMg_YMn_ZEu_\omega)SiO_4$ wherein x, y, z, and ω are respectively coefficients satisfying $0.1<x<1$, $0<y<0.5$, $0<z<0.1$, $y>z$, and $0.01<\omega<0.2$.

According to another aspect of the present invention, there is provided an LED light emitting device comprising a combination of an ultraviolet to blue light emitting diode having a luminescence peak wavelength of 360 to 470 nm with the above europium-manganese-activated alkaline earth magnesium silicate phosphor.

According to still another aspect of the present invention, there is provided an LED light emitting device comprising a combination of an ultraviolet light emitting diode having a luminescence peak wavelength of 370 to 430 nm with the above europium-manganese-activated alkaline earth magnesium silicate phosphor.

According to a further aspect of the present invention, there is provided an LED light emitting device comprising a combination of an ultraviolet to blue light emitting diode having a luminescence peak wavelength of 360 to 470 nm with a europium-manganese-activated alkaline earth magnesium silicate phosphor according to claim 1 and one or more of phosphors that emit blue or red light.

According to another aspect of the present invention, there is provided an LED light emitting device comprising a combination of an ultraviolet light emitting diode having a luminescence peak wavelength of 370 to 430 nm with a europium-manganese-activated alkaline earth magnesium silicate phosphor according to claim 1 and one or more of phosphors that emit blue or red light.

Effect of the Invention

Light emitted from the phosphor according to the present invention comprises luminescent components of three colors of red, blue, and green, and the phosphor according to the present invention can emit white light despite a single material. Accordingly, the phosphor according to the present invention can be solely combined with LED, and, thus, the occurrence of unevenness or the like in coating can be avoided. Further, even when a small amount of a red or blue phosphor is mixed for color correction purposes, the uniformity of luminescence of the mixed phosphor can be significantly improved since the phosphor according to the present invention per se contains red luminescence and blue luminescence. Therefore, the LED light emitting device according to the present invention can realize a high-quality light source that has a very low variation in color azimuth of luminescence, has high color rendering properties and has high brightness. Further, the LED light emitting device according to the present invention does not contain mercury and is environmentally friendly.

BRIEF DESCRIPTION OF DRAWINGS

FIG. 4 is a diagram showing a method for measuring an azimuthal color difference in such a state that an LED light emitting device is turned on.

DESCRIPTION OF REFERENCE CHARACTERS

Figure 1:
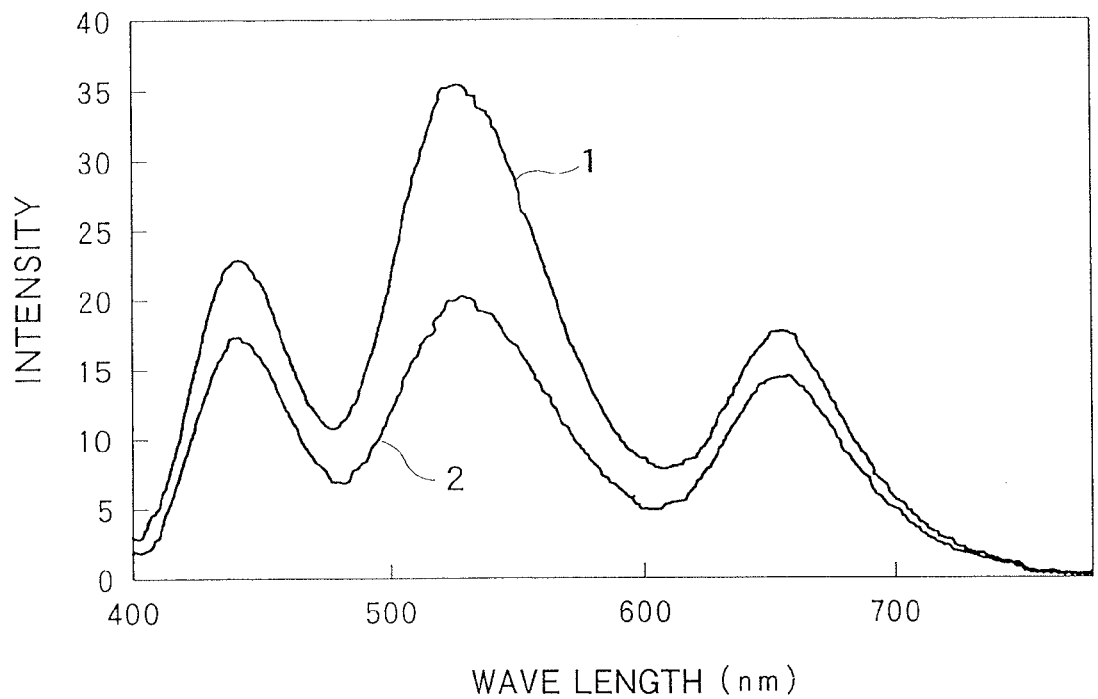
FIG. 1 is a diagram showing a fluorescence distribution spectrum that has characteristics of a phosphor according to the present invention.

1: Luminescence spectrum of phosphor $(Sr_{1.02}Ba_{0.45}Mg_{0.455}Mn_{0.045}Eu_{0.03})SiO_4$ according to the present invention
2: Luminescence spectrum of phosphor $(Sr_{1.02}Ba_{0.44}Mg_{0.44}Mn_{0.06}Eu_{0.04})SiO_4)SiO_4$ according to the present invention
3: Light emitting diode
4: Phosphor layer embedded in resin
5: Resin frame
6: White LED
7: Light receiving part in measuring machine

BEST MODE FOR CARRYING OUT THE INVENTION

FIG. 1 shows a luminescence spectrum of a phosphor according to the present invention. The spectrum was obtained by excitation with an ultraviolet light having a luminescence peak wavelength of 395 nm. In FIG. 1, spectrum 1 corresponds to a phosphor composition of $(Sr_{1.02}Ba_{0.45}Mg_{0.455}Mn_{0.045}Eu_{0.03})SiO_4$, and spectrum 2 corresponds to a phosphor composition of $(Sr_{1.02}Ba_{0.44}Mg_{0.44}Mn_{0.06}Eu_{0.04})SiO_4$. As is apparent from FIG. 1, the phosphor according to the present invention exhibits a spectrum having a peak in a blue region at a wavelength of 400 to 500 nm, a peak in a green to yellow region at a wavelength of 500 to 600 nm, and a peak in a red region at a wavelength of 600 to 700 nm and emits white light despite a single phosphor.

In FIG. 1, white light that was emitted from the phosphor having spectrum 1 had a luminescent chromaticity (CIE chromaticity value) of (0.324, 0.404), and white light that was emitted from the phosphor having spectrum 2 had a luminescent chromaticity of (0.331, 0.373). The luminescent chromaticity can be varied in a wide range by varying the composition of the phosphor. Specifically, in Eu-activated strontium silicate phosphor $(Sr_2SiO_4:Eu)$, the luminescence intensity of the yellow region can be varied by replacing a part (0.1 to 1 mole) of Sr with Ba; the luminescence intensity of the blue region can be varied by replacing a part (less than 0.5 mole) of Sr with Mg; and the luminescence intensity of the red region can be varied by replacing a part (less than 0.1 mole) of Sr with Mn, whereby the peak height in each of the wavelength ranges can be increased or decreased as desired.

The lower limit of the addition amount of each element is a limit value that, when the addition amount of the element is smaller than the limit value, an effective change in the luminescence spectrum is not observed, and the upper limit of the addition amount has been set as a value that provides a satisfactory effect of a change in spectrum and while taking into consideration a concentration balance between the elements. Regarding the molar ratio between magnesium (Mg) and manganese (Mn), Mg is preferably higher than Mn. This is so because, when Mn is higher than Mg, a colored crystal powder is obtained, resulting in lowered brightness.

The phosphor according to the present invention may be prepared, for example, by the following method. At the outset, strontium carbonate, barium carbonate, magnesium oxide, manganese carbonate, silicon oxide, and europium oxide are weighed as starting materials at a predetermined molar ratio and are thoroughly mixed together in a ball mill. In this case, for example, a halide which has flux action may be added. The resulting starting material mixture is filled into an aluminum crucible and is fired at a temperature of 1100 to 1300° C. for 4 to 6 hr. The firing is preferably carried out in a reducing atmosphere obtained by introducing nitrogen containing a few percentage of hydrogen into a furnace. The fired phosphor is ground in a mortar and may be again fired in a reducing atmosphere. The fired product is ground in a mortar, is poured into water, is washed by decantation, is further milled, is washed, and is then subjected to filtration, drying, and sieving to obtain a phosphor according to the present invention.

Figure 2:
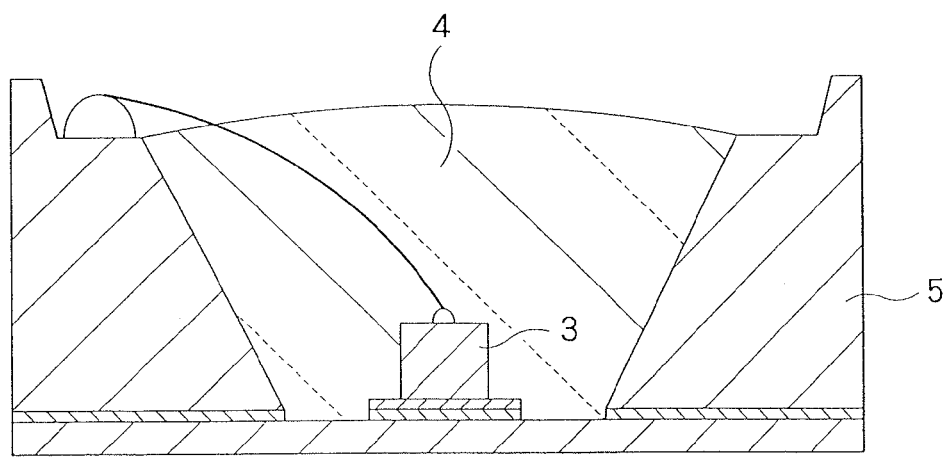
FIG. 2 is a cross-sectional view showing the construction of an LED light emitting device according to the present invention.

The LED light emitting device according to the present invention comprises a combination of a light emitting diode having a luminescence wavelength of 360 to 470 nm with one or more phosphors according to the present invention. Further, in the present invention, the phosphor may be used in combination with an ultraviolet light emitting diode having a luminescence wavelength of 370 to 430 nm. The LED light emitting device may have a construction having a cross section, for example, as shown in FIG. 2 In FIG. 2, numeral 3 designates a light emitting diode, numeral 4 a phosphor layer embedded in a resin, and numeral 5 a resin frame that supports a luminescent part. Electric energy applied to the LED light emitting device is converted to ultraviolet or blue light by the light emitting diode, a part of these lights is converted by the phosphor layer located on the upper part of the light emitting diode to light having a longer wavelength, and the ultraviolet or blue light is combined with the longer-wavelength light to constitute white light that is then radiated to the outside of the LED light emitting device.

Figure 3:
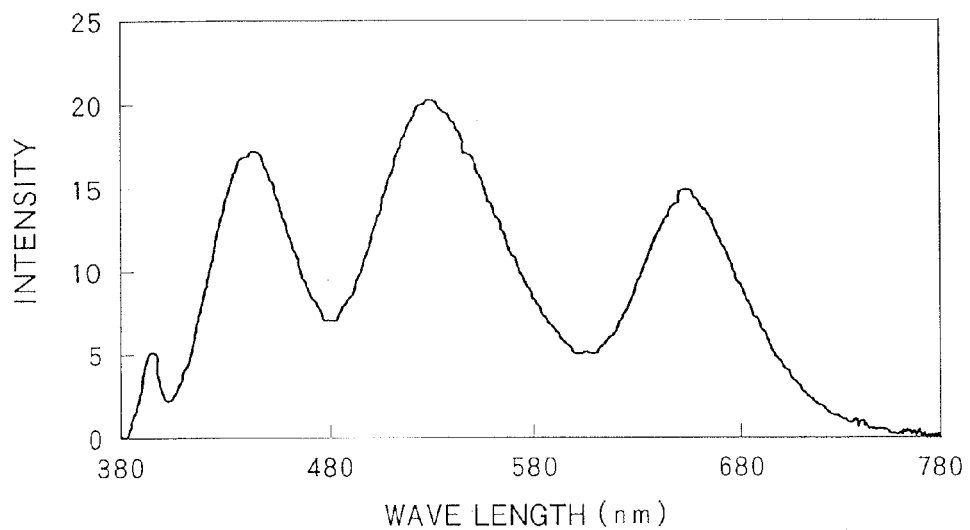
FIG. 3 is an example of a luminescence spectrum in an LED light emitting device according to the present invention.

FIG. 3 shows an example of a luminescence spectrum of an LED light emitting device obtained by combining an LED light emitting device having a construction as shown in FIG. 2 with a phosphor according to the present invention. Light is emitted from an ultraviolet light emitting diode at a current value of 20 mA and a peak value of 395 nm, and light that has been emitted from the LED light emitting device and has been converted to white light having a chromaticity of (0.280 to 0.380, 0.280 to 0.380) by the phosphor exhibits a spectrum having a very small peak, attributable to an ultraviolet excitation light component, at 395 nm and having luminescence peaks attributable to respective luminescent components of blue, green, and red, whereby property values of a brightness of not less than 400 mcd and an average color rendering index (Ra), which represents the quality of white light in use for illumination, of not less than 75.

The brightness and average color rendering index (Ra) of the LED light emitting device according to the present invention each are on a practical level, but are not significantly improved over LED light emitting devices of type 1 or type 2 that are currently used on an experiment basis in the world. The LED light emitting device according to the present invention is characterized in that the color difference (azimuthal color difference) is very small when LED which emits light is viewed in different azimuths. An azimuthal variation in color causes color unevenness of an object when light from LED is projected onto the object. Accordingly, in order to eliminate the color variation, a mechanism for mixing the white light by a diffusing plate or the like should be incorporated in the device, and this method is not favorable from a practical viewpoint. In the present invention, white light free from a color variation can be realized without adding the mixing mechanism.

Figure 4:
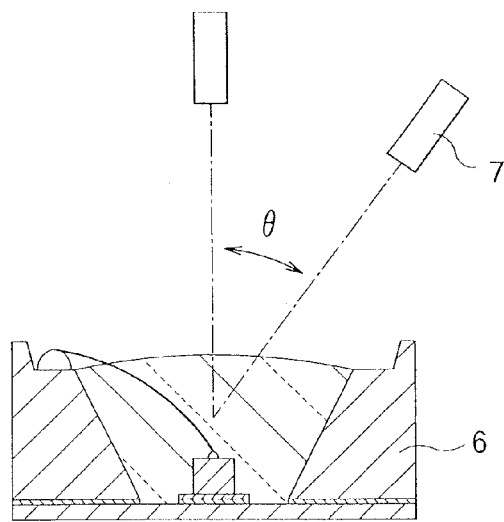

The azimuthal color difference can be evaluated, for example, by the following method. LED has a cross section as shown in FIG. 2 and, as viewed from above, has such a shape that a reflective layer is formed in a mortar form within a cylindrical resin frame. As shown in FIG. 4, the color difference in light emitted from the LED light emitting device is determined by first disposing a light receiving part 7 in measuring equipment just above white LED 6, measuring a chromaticity (x, y), then changing angle θ of the light receiving part 7, measuring a luminescent chromaticity (x', y'), determining the maximum value of absolute values of the difference between these values, and regarding the maximum value as an azimuthal color difference (Δx, Δy). The azimuthal color difference of the white LED shown in FIG. 3 was evaluated by this method and was found to be a very small and (Δx, Δy)=(0.001, 0.002).

The LED light emitting device according to the present invention comprises a phosphor according to the present invention coated onto a light emitting diode. For example, the LED light emitting device can be produced by adding a phosphor to a resin composition to prepare a coating liquid, coating the coating liquid onto a light emitting diode, and curing the resin. The phosphor according to the present invention may be solely used as the phosphor to be used in the LED light emitting device or alternatively may be used as a mixture comprised of the phosphor according to the present invention as a base with other phosphor(s). It has been found that, even when a phosphor prepared by further adding other phosphor such as blue or red phosphor to the phosphor according to the present invention is used, an LED light emitting device which has a smaller azimuthal color difference than conventional LED can be obtained.

EXAMPLES

Next, embodiments of the present invention is further illustrated by the following Examples that are not intended as a limitation of the invention.

The LED light emitting device according to the present invention has been evaluated as follows. The LED light emitting device had a construction having a cross section shown in FIG. 2. The LED light emitting device comprised a light emitting diode comprising a chip having a size of 300 μm square, and light was emitted at a current value of 20 mA to evaluate characteristics of the light emitting device. The light emitting diode had a luminescence wavelength of 380 to 420 nm (a luminescence peak wavelength of 400 nm) and had an output of 20 mW (20 mA). Some types of phosphors emitted brighter light upon exposure to short-wavelength excitation light. In this case, the light emitting diode had a luminescence wavelength of 360 to 400 nm (a luminescence peak wavelength of 380 nm). The light emitting diode had an output of 19 mW (20 mA). The luminescence characteristics of the LED light emitting device were evaluated using CAS 140 COMPACT ARRAY SPECTROMETER manufactured by Instrument Systems Inc. and an MCPD device manufactured by Otsuka Electronics Co., Ltd.

<Preparation of LED Light Emitting Device>

Two or more phosphors were separately mixed with a silicone resin at a mixing ratio of 10 to 20% by mass to prepare slurries. These slurries were blended so that the chromaticity of the LED light emitting device was x=0.280 to 0.380 and y=0.280 to 0.380. A part of the resulting slurry was extracted, was dropped on an LED light emitting device disposed as shown in FIG. 2, and was heat treated at a temperature of 100 to 150° C. to cure the silicone resin and thus to obtain an LED light emitting device.

Example 1

Starting materials were weighed and mixed together at a mixing ratio of 1.02 moles of strontium carbonate, 0.44 mole of barium carbonate, 0.44 mole of magnesium oxide, 0.06 mole of manganese carbonate, 0.02 mole of europium oxide, and 1.00 mole of silicon oxide. Further, 0.5% by mass, based on the starting materials, of ammonium chloride as a flux was added thereto, followed by mixing for one hr in a ball mill. The mixture thus obtained was filled into an alumina crucible, was fired for 5 hr in a reducing atmosphere containing 5% of hydrogen to obtain a phosphor. The phosphor thus synthesized was ground in a mortar and was passed through a mesh. Further, a decantation procedure consisting of stirring the phosphor in water, stopping the stirring, and discarding the supernatant was carried out five times. The slurry was then filtered, and the residue was dried. The dried product was passed through 200 meshes to obtain phosphor 1.

Subsequently, 30% by mass of phosphor 1 was mixed with a silicone resin, and the slurry was coated onto the light emitting diode. The coated light emitting diode was heat treated at 140° C. to cure the resin and thus to obtain an LED light emitting device.

Example 2

Phosphor 2 was obtained by the same treatment as in Example 1, except that starting materials were weighed and mixed together at a mixing ratio of 1.02 moles of strontium carbonate, 0.45 mole of barium carbonate, 0.455 mole of magnesium oxide, 0.045 mole of manganese carbonate, 0.015 mole of europium oxide, and 1.00 mole of silicon oxide. An LED light emitting device was then obtained in the same manner as in Example 1, except that phosphor 2 was used.

Example 3

Phosphor 3 was obtained by the same treatment as in Example 1, except that starting materials were weighed and mixed together at a mixing ratio of 1.1 moles of strontium carbonate, 0.41 mole of barium carbonate, 0.4 mole of magnesium oxide, 0.05 mole of manganese carbonate, 0.02 mole of europium oxide, and 1.00 mole of silicon oxide. An LED light emitting device was then obtained in the same manner as in Example 1, except that phosphor 3 was used.

Example 4

Phosphor 4 was obtained by the same treatment as in Example 1, except that starting materials were weighed and mixed together at a mixing ratio of 1.02 moles of strontium carbonate, 0.53 mole of barium carbonate, 0.35 mole of magnesium oxide, 0.055 mole of manganese carbonate, 0.0255 mole of europium oxide, and 1.00 mole of silicon oxide. An LED light emitting device was then obtained in the same manner as in Example 1, except that phosphor 4 was used.

Example 5

Phosphor 5 was obtained by the same treatment as in Example 1, except that starting materials were weighed and mixed together at a mixing ratio of 0.796 mole of strontium carbonate, 0.73 mole of barium carbonate, 0.37 mole of magnesium oxide, 0.06 mole of manganese carbonate, 0.022 mole of europium oxide, and 1.00 mole of silicon oxide. An LED light emitting device was then obtained in the same manner as in Example 1, except that phosphor 5 was used.

Example 6

Phosphor 6 was obtained by the same treatment as in Example 1, except that starting materials were weighed and mixed together at a mixing ratio of 0.82 mole of strontium carbonate, 0.65 mole of barium carbonate, 0.42 mole of magnesium oxide, 0.05 mole of manganese carbonate, 0.03 mole of europium oxide, and 1.00 mole of silicon oxide. An LED light emitting device was then obtained in the same manner as in Example 1, except that phosphor 6 was used.

Example 7

Phosphor 7 was obtained by the same treatment as in Example 1, except that starting materials were weighed and mixed together at a mixing ratio of 0.965 mole of strontium carbonate, 0.55 mole of barium carbonate, 0.4 mole of magnesium oxide, 0.045 mole of manganese carbonate, 0.02 mole of europium oxide, and 1.00 mole of silicon oxide. An LED light emitting device was then obtained in the same manner as in Example 1, except that phosphor 7 was used.

Example 8

Phosphor 8 was obtained by the same treatment as in Example 1, except that starting materials were weighed and mixed together at a mixing ratio of 0.98 mole of strontium carbonate, 0.6 mole of barium carbonate, 0.3 mole of magnesium oxide, 0.02 mole of manganese carbonate, 0.05 mole of europium oxide, and 1.00 mole of silicon oxide. A phosphor was prepared by mixing phosphor 8 thus obtained, a blue phosphor represented by $Sr_5(PO_4)Cl:Eu$ and a red phosphor represented by $Y_2O_2S:Eu$ at a mass ratio of 0.2:1.0:0.4.

Subsequently, 30% by mass of the phosphor was mixed with a silicone resin, and the slurry was coated onto the light emitting diode. The coated light emitting diode was heat treated at 140° C. to cure the resin and thus to obtain an LED light emitting device.

Example 9

Phosphor 9 was obtained by the same treatment as in Example 1, except that starting materials were weighed and mixed together at a mixing ratio of 0.945 mole of strontium carbonate, 0.7 mole of barium carbonate, 0.2 mole of magnesium oxide, 0.005 mole of manganese carbonate, and 0.075 mole of europium oxide. A phosphor was prepared by mixing phosphor 9 thus obtained, a blue phosphor represented by $(Sr,Ba)_5(PO_4)Cl:Eu$ and a red phosphor represented by $La_2O_2S:Eu,Sm$ at a mass ratio of 0.2:1.0:0.3.

Subsequently, 30% by mass of the phosphor was mixed with a silicone resin, and the slurry was coated onto the light emitting diode. The coated light emitting diode was heat treated at 140° C. to cure the resin and thus to obtain an LED light emitting device.

Example 10

Phosphor 10 was obtained by the same treatment as in Example 1, except that starting materials were weighed and mixed together at a mixing ratio of 1.247 moles of strontium carbonate, 0.5 mole of barium carbonate, 0.15 mole of magnesium oxide, 0.003 mole of manganese carbonate, 0.05 mole of europium oxide, and 1.00 mole of silicon oxide. A phosphor was prepared by mixing phosphor 10 thus obtained, a blue phosphor represented by $BaMgAl_{10}O_{17}:Eu$ and a red phosphor represented by $La_2O_2S:Eu$ at a mass ratio of 0.1:1.0:0.4.

Subsequently, 30% by mass of the phosphor was mixed with a silicone resin, and the slurry was coated onto the light emitting diode. The coated light emitting diode was heat treated at 140° C. to cure the resin and thus to obtain an LED light emitting device.

Comparative Example 1

A phosphor was prepared by mixing a blue phosphor represented by $(Sr,Ba)_5(PO_4)_3Cl:Eu$, a green phosphor represented by $BaMgAl_{10}O_{17}:Eu,Mn$ and a red phosphor represented by $La_2O_2S:Eu$ at a mass ratio of 0.2:1.0:0.3.

Subsequently, 30% by mass of the phosphor was mixed with a silicone resin, and the slurry was coated onto the light emitting diode. The coated light emitting diode was heat treated at 140° C. to cure the resin and thus to obtain a conventional LED light emitting device.

Comparative Example 2

A slurry prepared by mixing 15% by mass of a europium-activated strontium-barium-orthosilicate, which is a yellow phosphor represented by $(Sr,Ba)_2SiO_4:Eu$, with a silicone resin was coated onto the light emitting diode. The coated light emitting diode was heat treated at 140° C. to cure the resin and thus to obtain a conventional LED light emitting device.

A current of 20 mA was allowed to flow into each of the LED light emitting devices thus obtained to emit light. In this case, the brightness and azimuthal color difference of the luminescence were as shown in Table 1.

TABLE 1

| | Phosphor Chemical composition | Characteristics of light emitting device | | |
|---|---|---|---|---|
| | | Wavelength of excitation by diode (nm) | Brightness (mcd) | Azimuthal color difference ($\Delta x, \Delta y$) |
| Ex. 1 | $(Sr_{1.02},Ba_{0.44},Mg_{0.44},Mn_{0.06},Eu_{0.04})SiO_4$ | 400 | 400 | (0.001, 0.002) |
| Ex. 2 | $(Sr_{1.02},Ba_{0.45},Mg_{0.455},Mn_{0.045},Eu_{0.03})SiO_4$ | 400 | 410 | (0.002, 0.002) |
| Ex. 3 | $(Sr_{1.1},Ba_{0.41},Mg_{0.4},Mn_{0.05},Eu_{0.04})SiO_4$ | 400 | 420 | (0.001, 0.001) |
| Ex. 4 | $(Sr_{1.02},Ba_{0.53},Mg_{0.35},Mn_{0.055},Eu_{0.045})SiO_4$ | 400 | 400 | (0.002, 0.002) |
| Ex. 5 | $(Sr_{0.796},Ba_{0.73},Mg_{0.37},Mn_{0.06},Eu_{0.044})SiO_4$ | 400 | 410 | (0.001, 0.002) |
| Ex. 6 | $(Sr_{0.82},Ba_{0.65},Mg_{0.42},Mn_{0.05},Eu_{0.06})SiO_4$ | 400 | 440 | (0.002, 0.002) |
| Ex. 7 | $(Sr_{0.965},Ba_{0.55},Mg_{0.4},Mn_{0.045},Eu_{0.04})SiO_4$ | 380 | 440 | (0.002, 0.002) |
| Ex. 8 | $(Sr_{0.98},Ba_{0.6},Mg_{0.3},Mn_{0.02},Eu_{0.1})SiO_4$ <br> $Sr_5(PO_4)_3Cl: Eu$ <br> $Y_2O_2S: Eu$ | 380 | 410 | (0.002, 0.003) |

TABLE 1-continued

|  | Phosphor Chemical composition | Wavelength of excitation by diode (nm) | Brightness (mcd) | Azimuthal color difference ($\Delta x, \Delta y$) |
|---|---|---|---|---|
| Ex. 9 | $(Sr_{0.945},Ba_{0.7},Mg_{0.2},Mn_{0.005},Eu_{0.15})SiO_4$<br>$(Sr,Ba)_5(PO_4)_3Cl$: Eu<br>$La_2O_2S$: Eu,Sm | 400 | 420 | (0.001, 0.003) |
| Ex. 10 | $(Sr_{1.247},Ba_{0.5},Mg_{0.15},Mn_{0.003},Eu_{0.1})SiO_4$<br>$BaMgAl_{10}O_{17}$: Eu<br>$La_2O_2S$: Eu | 400 | 430 | (0.003, 0.002) |
| Comp. Ex. 1 | $(Sr,Ba)_5(PO_4)_3Cl$: Eu<br>$BaMgAl_{10}O_{17}$: Eu,Mn<br>$La_2O_2S$: Eu,Sm | 400 | 400 | (0.010, 0.008) |
| Comp. Ex. 2 | $(Sr,Ba)_2SiO_4$: Eu | 460 | 490 | (0.020, 0.020) |

As is apparent from Table 1, according to the present invention, LED light emitting devices having a significantly improved azimuthal color difference can be obtained. Further, the phosphor according to the present invention comprises luminescent components of three colors of red, blue, and green and thus has high color rendering properties and can emit bright light.

The invention claimed is:

1. A process for producing europium-manganese-activated alkaline earth magnesium silicate phosphor comprising the steps of:
    mixing a strontium compound, a barium compound, magnesium oxide, a manganese compound, silicon oxide, europium oxide and a halide compound as a flux;
    filling the mixture into a crucible;
    firing the mixture at 1100 to 1300° C. for 4 to 6 hours in an atmosphere containing nitrogen and hydrogen to form a fired product;
    grinding the fired product to form a powder of the fired product; and
    firing again the powder in a reducing atmosphere.

2. The process according to claim 1, wherein the strontium compound, the barium compound and the manganese compound are carbonate compounds.

3. The process according to claim 1, wherein the crucible is an aluminum crucible.

* * * * *